United States Patent [19]

Miyajima et al.

[11] Patent Number: 5,144,395
[45] Date of Patent: Sep. 1, 1992

[54] OPTICALLY DRIVEN SEMICONDUCTOR DEVICE

[75] Inventors: Toshiaki Miyajima, Ikoma; Kazumasa Kioi, Fujiidera; Mituo Matunami; Tukasa Doi, both of Tenri; Minoru Yoshioka, Shiki; Masayoshi Koba, Nara, all of Japan

[73] Assignee: Sharp Kabushiki Kaisha, Japan

[21] Appl. No.: 672,764

[22] Filed: Mar. 19, 1991

Related U.S. Application Data

[63] Continuation of Ser. No. 375,327, Jul. 3, 1989, abandoned.

[30] Foreign Application Priority Data

Jul. 4, 1988 [JP] Japan .................. 63-166438
Aug. 5, 1988 [JP] Japan .................. 63-196343

[51] Int. Cl.⁵ .................................. H01L 27/14
[52] U.S. Cl. ........................ 357/30; 357/19; 357/41
[58] Field of Search ............ 357/30 D, 30 G, 30 H, 357/30 I, 30 J, 30 L, 30 R, 32, 19, 23.4, 41, 30 PF; 307/311; 250/213 A

[56] References Cited

U.S. PATENT DOCUMENTS

| | | | |
|---|---|---|---|
| 3,465,293 | 9/1969 | Weckler . | |
| 4,268,843 | 5/1981 | Brown et al. | 357/30 |
| 4,873,202 | 10/1989 | Akiyama | 357/19 |
| 4,894,699 | 1/1990 | Hayashi et al. | 357/30 I |
| 4,931,656 | 6/1990 | Ehalt et al. | 357/19 |

FOREIGN PATENT DOCUMENTS

| | | | |
|---|---|---|---|
| 3000890 | 9/1980 | Fed. Rep. of Germany | 357/30 |
| 0022360 | 2/1984 | Japan | 357/30 J |
| 0272967 | 12/1986 | Japan | 357/30 |
| 63-283081 | 4/1987 | Japan . | |
| 62-106660 | 5/1987 | Japan | 357/30 H |
| 2-7478 | 1/1990 | Japan | 357/19 |
| 2-16778 | 1/1990 | Japan | 357/19 |
| 3-22487 | 1/1991 | Japan | 357/19 |

OTHER PUBLICATIONS

Koi et al., "SOI Photodiode . . . Switching", IEEE, Dec. 1987.
Patent Abstracts of Japan, vol. 11, No. 314 (Oct. 13, 1987) 62-106660.
French Patent Publication No. 2,590,750, La Telemecanique Electrique (Nov. 22, 1985).
Patent Abstracts of Japan, vol. 11, No. 341, (Nov. 7, 1987) 62-122180.
Proceedings of the IEDM–International Electron Devices Meeting, Washington, D.C., Dec. 6-9, 1987, 18.7 "SOI Photodiode Array Stacked on VDMOS For Optical Switching" by Kazumasa Kioi et al.
Patent Abstracts of Japan, vol. 11, No. 95 (E-492) (2542), Mar. 25, 1987.

Primary Examiner—Andrew J. James
Assistant Examiner—Minhloan Tran
Attorney, Agent, or Firm—Morrison & Foerster

[57] ABSTRACT

An optically driven semiconductor device is disclosed which comprises a semiconductor substrate, a plurality of vertical field effect transistors formed on the substrate, and a plurality of optoelectric transducers formed on an insulating film above the respective transistors, wherein the transistors have the substrate in common as a drain. Also disclosed is an optically driven semiconductor device which comprises a semiconductor substrate, a vertical field effect transistor formed on the substrate and a solar cell formed on an insulating film above the substrate, wherein the solar cell is formed with a polycrystalline silicon layer or monocrystalline silicon layer grown by the chemical vapor deposition method. Moreover, there are disclosed optically coupled semiconductor relay devices using these optically driven semiconductor devices.

8 Claims, 9 Drawing Sheets

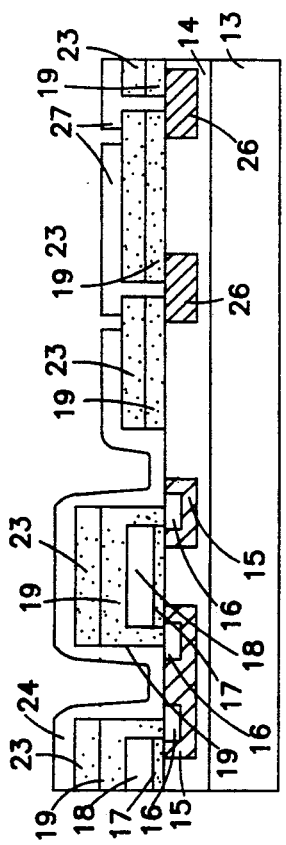
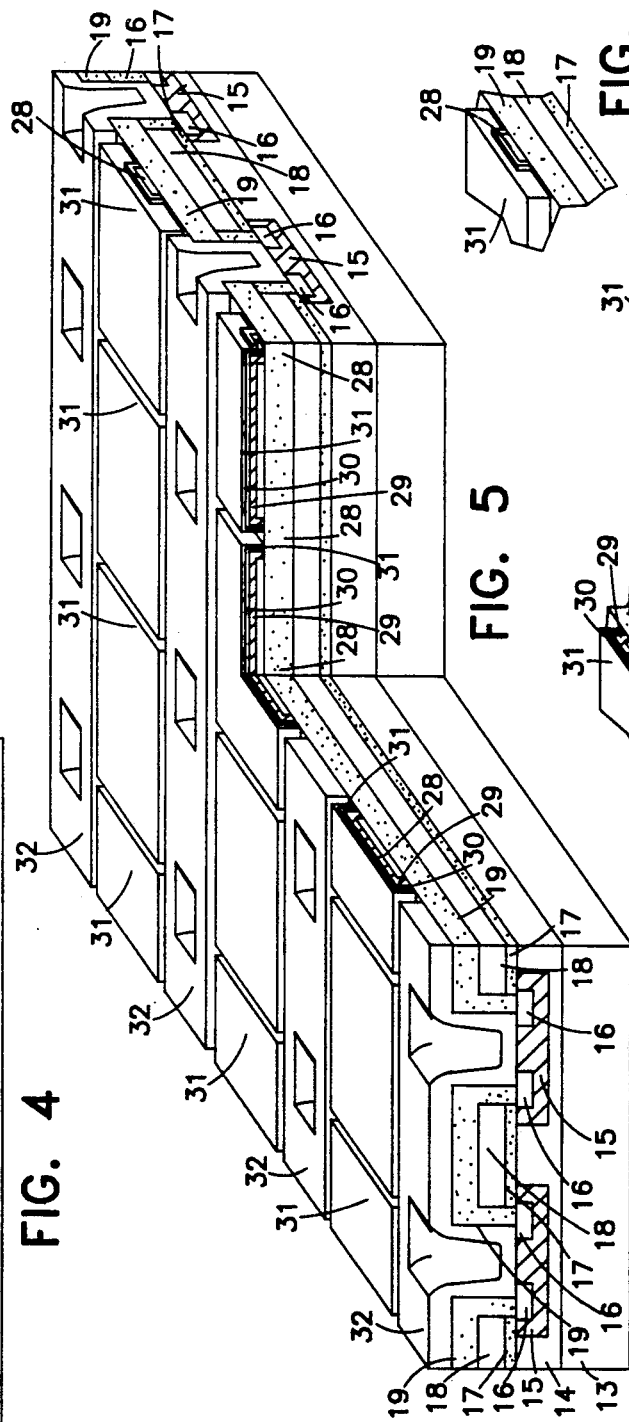
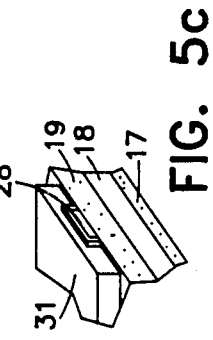
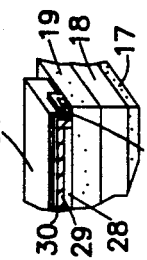
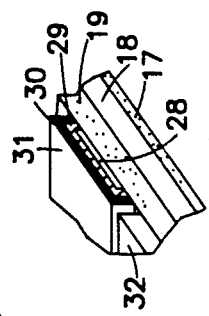

OPTICALLY DRIVEN SEMICONDUCTOR DEVICE

This application is a continuation of application Ser. No. 07/375,327, filed Jul. 3, 1989, now abandoned.

BACKGROUND OF THE INVENTION

1. Field of the Invention:

The present invention relates to an optically driven semiconductor device in which switching operations are performed according to an optical signal. The present invention also relates to a semiconductor relay device, and more particularly it relates to an optically coupled semiconductor relay device, which comprises a light emitting part for generating the optical signal and a photodetector part for performing switching operations according to this optical signal, wherein the above-mentioned optically driven semiconductor device is used as the photodetector part.

2. Description of the Prior Art:

In recent years, with the achievement of rapid developments in the semiconductor technology, there have been increased demands for higher performances and miniaturization of hardware in various control systems, along with the digitalization thereof. However, the input/output parts of these control systems still process analog signals, and when viewed from the whole system, digital circuits and analog circuits are arranged in a mixed form within the same system. Accordingly, it is an important subject that analog signals (particularly, minute voltages and currents) are reliably processed and that the processed signals are introduced into the control part of the system.

As a device for controlling an output-side circuit insulated electrically from an input-side circuit according to the signals given to the input-side circuit, electromagnetic relay devices have been mainly used. However, electromagnetic relay devices have movable mechanical parts, therefore the relay device itself is large in size, and it is difficult to make the equipment using this relay device smaller in size. Moreover, electromagnetic relay devices have disadvantages in that the movable mechanical parts are easily fatigued and the life thereof is short.

In recent years, in place of such electromagnetic relay devices, semiconductor relay devices, referred to as solid state relays (SSRs), having the advantages of small size, light weight, and long life have been widely applied. However, for example, the semiconductor relay devices using bipolar transistors or thyristors can only be used either with alternating current or direct current.

To solve these problems, a semiconductor relay device capable of being used with either alternating current or direct current by the use of two metal oxide semiconductor field effect transistors (MOSFETs) has been developed. This is an optically coupled semiconductor relay device which is composed of a light emitting part, comprising a light emitting diode, and a photodetector part, comprising photodiodes and MOSFETs. FIG. 7 shows an equivalent circuit of the semiconductor relay device. Photodiode arrays 41 and 42 of the photodetector part receive an optical signal emitted from a light emitting diode 38 of the light emitting part and perform photoelectric conversions, so that MOSFETs 39 and 40 are driven by the obtained electromotive forces. The respective source electrodes of the MOSFETs 39 and 40 are connected to each other, and the respective electromotive forces of the photodiode arrays 41 and 42 are applied between the gate electrode and the source electrode of each of the MOSFETs 39 and 40, respectively. Thus, the current flowing between the drains of the MOSFETs 39 and 40 is controlled.

The above-mentioned optically coupled semiconductor relay device requires a total of five elements (i.e., one light emitting diode, two photodiode arrays, and two MOSFETs). As a method for miniaturizing the semiconductor relay device and for reducing the manufacturing cost thereof by further decreasing the number of elements to be used, a method has been proposed in which the photodiode arrays are disposed on an insulating film above the vertical MOSFETs. By adopting this method, the MOSFET and the photodiode array are formed integrally, so that the optically coupled semiconductor relay device can be realized with the use of a total of three elements.

However, in the above-mentioned method, it is required to apply wiring between two vertical MOSFETs with photodiode arrays disposed thereon. Accordingly, the production cost of the relay device is still high and the miniaturization of the relay device is limited.

On the other hand, to solve the above-mentioned problems, photo MOS relays have been put in practical use. The photo MOS relay is a kind of optically coupled semiconductor relay device, in which the input part and the output part are electrically insulated completely from each other, but are coupled optically with each other. When a current flows through the input side of this photo MOS relay, a light emitting element (e.g., a light emitting diode) emits light, and an optoelectric transducer (e.g., a small-sized solar cell of high voltage output type) receives this optical output, thereby generating a photoelectromotive force. This photoelectromotive force is applied to a power MOSFET as a gate voltage, and this power MOSFET is put in on-state or off-state, thereby making it possible to control a load of the output side.

However, in the conventional photo MOS relay, the optoelectric transducer is disposed so as to face the light emitting device in the same package, and the power MOSFET driven by the electromotive force of this optoelectric transducer is further incorporated thereinto. Accordingly, it is required to mount three or more independent chips in the same package, and therefore there exist several problems, in that the structure of the relay device is complicated, the production cost becomes higher, and the reliability of the relay device itself is reduced. In addition, the above-mentioned power MOSFET and optoelectric transducer are produced individually using separate substrates, and therefore there exists some problems in that no portions can be disposed, which are utilized in common by these elements, and no manufacturing processes can be employed which are used in common for these elements, so causing the production cost to rise.

To solve such problems, it has been proposed that the power MOSFET and the optoelectric transducer are disposed on the same substrate. For example, in the Japanese Laid-Open Patent Publication No. SHO-106660/1987, there has been disclosed a semiconductor device in which an optoelectric transducer is disposed on an insulating film above the semiconductor substrate containing MOSFETs and the like formed thereon. The optoelectric transducer is formed with amorphous Si or monocrystalline Si grown on the insulating film.

However, in the case where amorphous Si is used for the optoelectric transducer, when amorphous Si is deposited on the lower electrode of a predetermined pattern formed on the insulating film, for example, by the discharge plasma method, the MOSFETs on the same substrate suffer serious damage, so that the threshold voltage is varied. Although heat treatment at high temperatures are required to recover this varied value, the amorphous Si film is destroyed during this treatment, so that the recovery of the threshold voltage is difficult. Accordingly, there is a possibility that the device characteristics of the MOSFETs disposed on the same substrate deviate from the design values. Moreover, when the amorphous solar cell is formed, electrodes are required to be provided on the upper and lower sides of the amorphous Si film, so that the manufacturing process is complicated, causing the production cost to rise. Furthermore, the optoelectric transducer using amorphous Si has a possibility that the photoelectric conversion characteristics deteriorate with use over a long period of time, causing lack of reliability.

On the other hand, in the case where monocrystalline Si is used for the photoelectric transducer, there has been proposed a method in which a polycrystalline thin film or amorphous thin film of Si is formed on an insulating film, and then the thin film of Si is irradiated with laser beams and melted, after which it is cooled to form monocrystals. However, such a method has the disadvantages in that the manufacturing process is complicated, causing the productivity to become poor and the production yield of the device is low, causing the production cost to rise.

SUMMARY OF THE INVENTION

The optically driven semiconductor device of this invention, which overcomes the above-discussed and numerous other disadvantages and deficiencies of the prior art, comprises a semiconductor substrate, a plurality of vertical field effect transistors formed on the substrate, and a plurality of optoelectric transducers formed on an insulating film above the respective transistors, wherein the transistors have the substrate in common as a drain.

In a preferred embodiment, the optoelectric transducer is a photodiode array.

In a preferred embodiment, the transistor is of metal oxide semiconductor type.

An optically driven semiconductor device of this invention comprises a semiconductor substrate, a vertical field effect transistor formed on the substrate, and a solar cell formed on an insulating film above the substrate, wherein the solar cell is formed with a polycrystalline silicon layer or monocrystalline silicon layer grown by the chemical vapor deposition method.

In a preferred embodiment, the solar cell and said transistor are disposed in a planar from on said substrate.

In a preferred embodiment, the solar cell is disposed on the insulating film above said transistor.

In a preferred embodiment, further comprises a peripheral circuit containing a deplation type field effect transistor.

An optically coupled semiconductor relay device of this invention comprises a light emitting part for generating an optical signal and a photodetector part for performing switching operation according to said optical signal, wherein said photodetector part has an optically driven semiconductor device of claim 1.

In a preferred embodiment, the light emitting part has at least one light emitting diode.

An optically coupled semiconductor relay device of this invention comprises a light emitting part for generating an optical signal and a photodetector part for performing switching operation according to said optical signal, wherein said photodetector part has an optically driven semiconductor device of claim 4.

In a preferred embodiment, the light emitting part has at least one light emitting diode.

Thus, the invention described herein makes possible the objectives of (1) providing an optically driven semiconductor device in which vertical MOSFETs above which optoelectric transducers are formed on an insulating film have a semiconductor substrate in common as a drain, so that there is no need to connect the vertical MOSFETs, allowing a lower production cost and miniaturization of the semiconductor device; (2) providing an optically driven semiconductor device by which, when a semiconductor relay device is produced using the semiconductor device, the production cost of the semiconductor relay device can be reduced because of the small number of chips to be mounted in the package of the semiconductor relay device and also the reliability of the semiconductor relay device can be improved because of the simple structure of the semiconductor device; (3) providing an optically driven semiconductor device in which a high voltage output solar cell is formed with a polycrystalline Si layer or monocrystalline Si layer grown by the chemical vapor deposition method, so that the production cost can be reduced and the reliability can be improved relative to the conventional cases where amorphous Si formed by the discharge plasma method or monocrystalline Si formed by the laser melt crystarization method is used to produce the solar cell; (4) providing an optically driven semiconductor device in which a vertical MOSFET and a high voltage output solar cell are formed integrally on the same substrate, so that several portions can be disposed which are utilized in common by these elements and several manufacturing processes can be employed which are used in common for these elements, allowing a lower production cost relative to the conventional cases where the vertical MOSFET and the solar cell are produced individually using separate substrates; (5) providing an optically driven semiconductor device in which a peripheral circuit containing a depletion type MOSFET or the like is disposed on the same substrate, so that the rate of switching operation can be improved, contributing to higher performances of semiconductor relay devices using the semiconductor device; (6) providing an optically coupled semiconductor relay device capable of being used either with alternating current or direct current in which a photodetector part is composed of only one element, allowing further miniaturization and a lower production cost; and (7) providing an optically coupled semiconductor relay device which can be widely applied in the fields where conventional electromagnetic relay devices have been used, because of its small size and lower production cost.

BRIEF DESCRIPTION OF THE DRAWINGS

This invention may be better understood and its numerous objects and advantages will become apparent to those skilled in the art by reference to the accompanying drawings as follows:

FIG. 4a is a fragmentary sectional view showing the optically driven semiconductor device taken along line A—A' of FIG. 3.

FIG. 5 is a partially cutaway fragmentary perspective view showing another optically driven semiconductor device of this invention.

FIGS. 5a–5c show detail of the portions of FIG. 5.

DESCRIPTION OF THE PREFERRED EMBODIMENTS

As a light emitting element constituting a light emitting part in the optically coupled semiconductor relay device of this invention, for example, a light emitting diode can be used. The light emitting diode emits visible light or near visible light when a voltage is applied thereto. On the other hand, as an optoelectric transducer constituting a photodetector part, for example, a photodiode can be used. The photodiode generates a photocurrent or a photoelectromotive force when illuminated with light of a predetermined wavelength. The above-mentioned light emitting diode and photodiode are selected to have a wavelength band in which the both diodes are optically coupled with each other.

Figure 6:
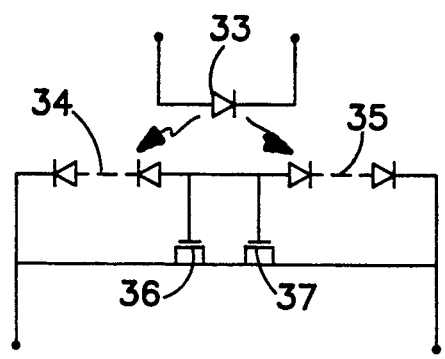
FIG. 6 is a diagram showing an equivalent circuit of the optically coupled semiconductor relay device of FIG. 2.
Figure 7:
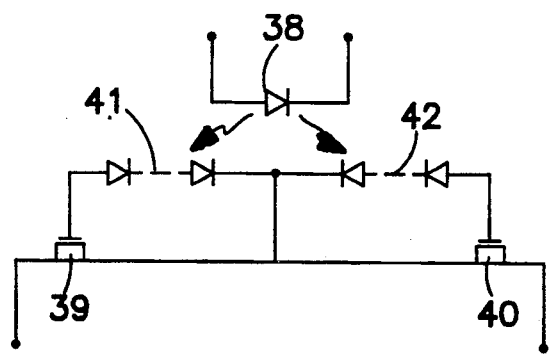
FIG. 7 is a diagram showing an equivalent circuit of the conventional optically coupled semiconductor relay device.

An equivalent circuit of an optically coupled semiconductor relay device of this invention can be represented, for example, as shown in FIG. 6. A light emitting diode 33 constituting the light emitting part converts a given input electric signal into an optical signal. The optical signal emitted from the light emitting diode 33 reaches photodiode arrays 34 and 35 constituting a photodetector part. In FIG. 6, one light emitting diode 33 is used with respect to a set of photodiode arrays 34 and 35. Alternatively, one light emitting diode may be used so as to face each of the photodiode arrays 34 and 35.

The photodiode arrays 34 and 35 convert their received optical signals into electric signals. These electric signals are given in the form of electromotive force, by which vertical MOSFETs 36 and 37 are driven. The drain electrodes of the vertical MOSFETs 36 and 37 are connected to each other, and the respective electromotive forces of the photodiode arrays 34 and 35 are applied between the gate electrode and the source electrode of each of the vertical MOSFETs 36 and 37. Each one of the sources of transistors 36 and 37 is connected to an output terminal. Thus, the current flowing between the sources of the vertical MOSFETs 36 and 37 and therefore the current flowing between the output terminals of the optically coupled semiconductor relay device is controlled.

In an optically driven semiconductor device used in the optically coupled semiconductor relay device of this invention, the above-mentioned optoelectric transducers (i.e., the photodiode arrays) are disposed on an insulating film above the vertical MOSFETs. In addition, the vertical MOSFETs are formed on one semiconductor substrate so as to have this substrate in common as a drain. Accordingly, miniaturization of the relay device can be made by integrally forming these elements constituting the photodetector part. Moreover, the production cost of the relay device can be reduced by decreasing the number of elements.

In another optically driven semiconductor device of this invention, vertical MOSFETs and a high voltage output solar cell are formed, for example, in a planar form on a substrate. In this case, the solar cell is disposed on an insulating film formed on the substrate. Alternatively, it is also possible that the vertical MOSFETs are disposed on the substrate and then coated with an insulating film, after which the solar cell is disposed on the insulating film.

The high voltage output solar cell is composed of a plurality of solar cell elements. For example, a Si polycrystalline layer or Si monocrystalline layer is formed on the above-mentioned insulating film by the chemical vapor deposition method, the Si layer is divided into a plurality of island-shaped regions by the selective etching method, the solar cell element is incorporated in each of these island-shaped regions, and these elements are connected by means of electrodes to form the solar cell.

Usually, the high voltage output solar cell used in the photo MOS relay or the like is disposed so as to face the light emitting element (e.g., the light emitting diode) with a gap of hundreds of micrometers kept therefrom. In this case, the solar cell can readily drive power MOSFETs if the solar cell is used with a large light energy such that the light intensity is 100 mW/cm$^2$ and the conversion efficiency thereof is about 2 to 3%. In the present invention, it is easy to obtain this extent of conversion efficiency even in the case where the solar cell is produced using a Si polycrystalline layer formed on the insulating film above the vertical MOSFETs.

The above-mentioned optically driven semiconductor device of this invention may integrate a peripheral circuit comprising depletion type MOSFETs and the like as required for the purpose of improving the rate of switching operation. This is achieved in such a manner that a monocrystalline part and a polycrystalline part made of enlarged crystal grains are formed on the above-mentioned insulating film by the epitaxial lateral overgrowth (ELO) technique, after which the peripheral circuit comprising depletion type MOSFETs and the like is incorporated in the monocrystalline part, while the solar cell is incorporated in the polycrystalline part.

To improve the rate of switching operation, for example, the resistance of the substrate, due to its thickness, may be reduced by making the substrate thinner with the application of a lapping treatment to the bottom surface of the substrate.

EXAMPLE 1

Figure 2:
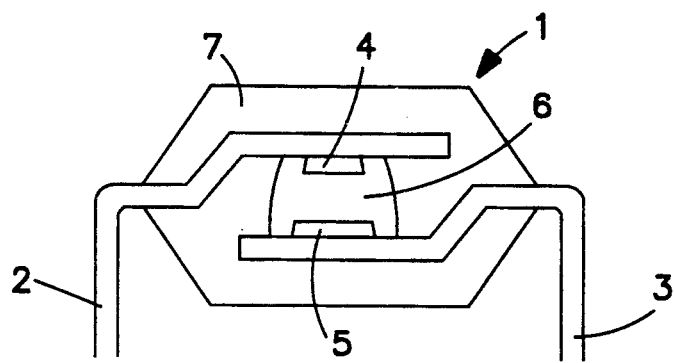
FIG. 2 is a schematic view in section showing an optically coupled semiconductor relay device of this invention.

FIG. 2 shows the structure of an optically coupled semiconductor relay device 1 of this invention. In the vicinity of the respective ends of lead frames 2 and 3, a light emitting part 4 and a photodetector part 5 are disposed respectively so as to face each other. A light emitting diode is used as a light emitting element constituting the light emitting part 4. Between the light emitting part 4 and the photodetector part 5, there is disposed resin 6 capable of transmitting optical signals emitted from the light emitting part 4. The whole area in the vicinity of the respective ends of the lead frames 2 and 3 is coated with resin 7 having a light shielding property to eliminate the possibility of faulty operation caused by external light.

Figure 3:
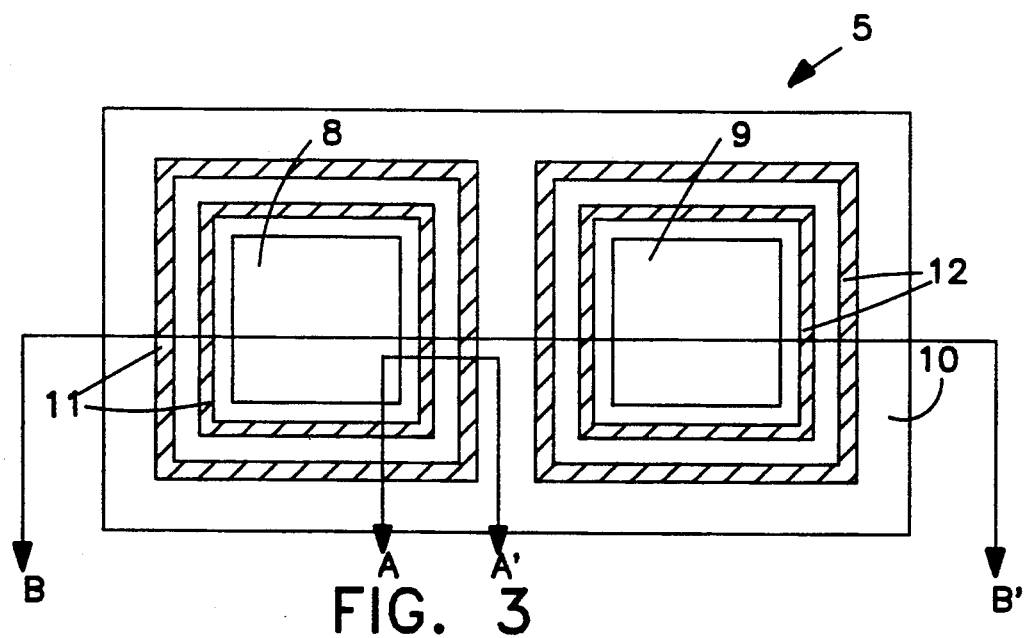
FIG. 3 is a schematic view in plan showing the optically driven semiconductor device of FIG. 1.

FIG. 3 is a schematic view in plan showing an optically driven semiconductor device as the photodetector part 5 when viewed from above. As an optoelectric transducer, a set of photodiode arrays were used. Vertical MOSFETs 8 and 9 above which the respective photodiode arrays are disposed on an insulating film are formed on the same semiconductor substrate 10. These vertical MOSFETs 8 and 9 are connected to each other by having the semiconductor substrate 10 in common as a drain. Around the vertical MOSFETs 8 and 9, guard rings 11 and 12 are formed respectively to raise the withstand voltage of the device. Lines A—A' and B—B' relate to cross-sectional views of the optically driven semiconductor device shown in FIGS. 4a and 4b.

Figures 1, 1A:
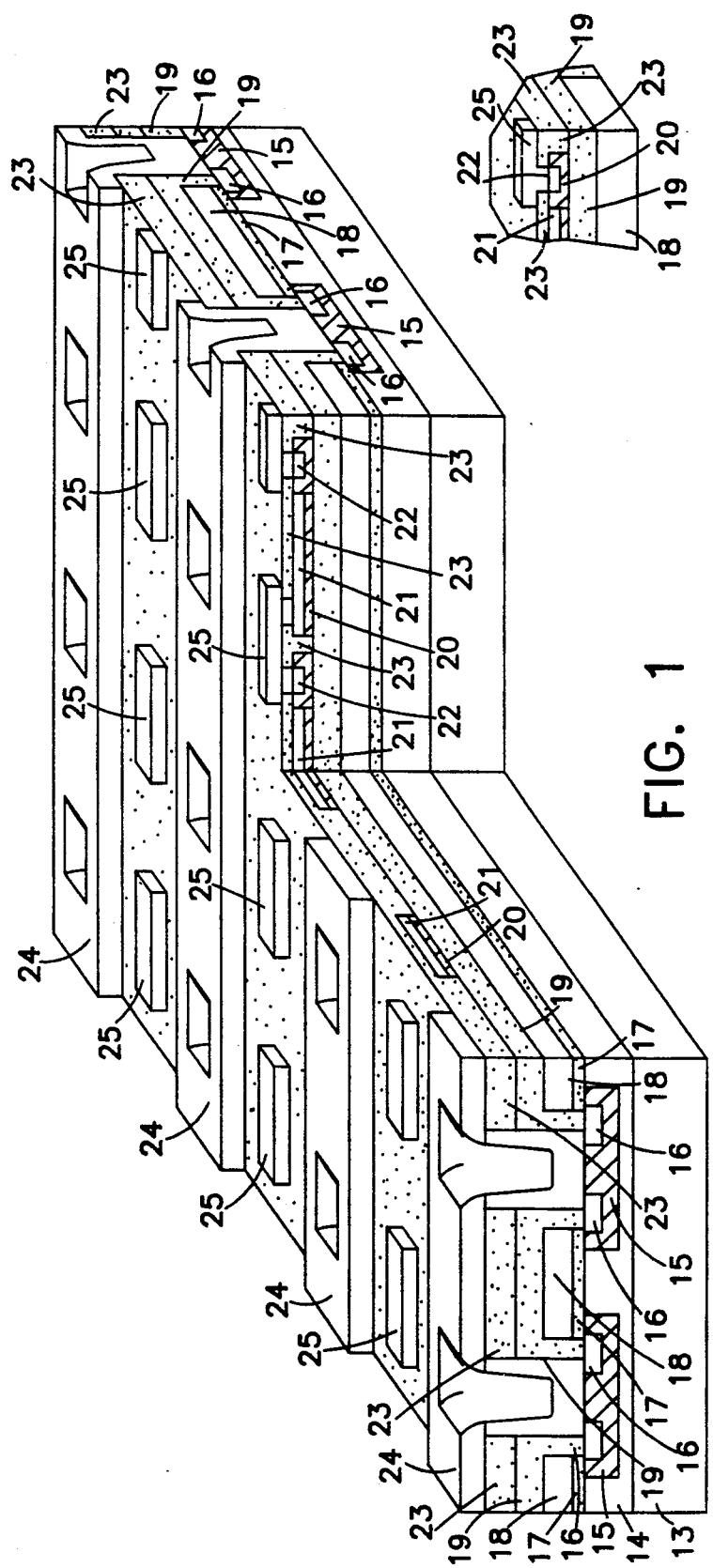
FIG. 1 is a partially cutaway fragmentary perspective view showing an optically driven semiconductor device of this invention.
FIG. 1a shows detail of a portion of FIG. 1.

FIG. 1 is a fragmentary perspective view showing the vertical MOSFET 8 or 9 of FIG. 3, above which the photodiode array is disposed on the insulating film. There will be explained a method for fabricating such vertical MOSFETs 8 and 9. An n-Si epitaxial layer 14 with a thickness of 30 μm was grown on an n+-Si substrate 13, and boron ions were implanted using a photoresist mask, resulting in island-shaped p-type regions 15. Then, n+-type annular regions 16 were formed in the respective center portions of the island-shaped p-type regions 15 by implantation of phosphorus ions using a photoresist mask. A gate insulating film 17 was formed by thermal-oxidizing the entire surface, and thereafter an n+-Si polycrystalline film 18 corresponding to the gate electrode was formed on the entire surface.

Then, an etching treatment was performed by conventional lithography, so that the gate insulating film 17 and the n+-Si polycrystalline film 18 were left only outside the annular n+-type regions 16 as shown in FIG. 1. An SiO₂ film 19 was formed on the entire surface, after which a Si non-monocrystalline film doped with boron ions was formed thereon and was irradiated with argon laser beams, resulting in a p-Si monocrystalline film. In place of the argon laser apparatus, another laser apparatus may be used which emits laser light of a wavelength absorbed in the Si non-monocrystalline film. Alternatively, by irradiating electron beams or by heating with the use of a lamp or heater, the Si non-monocrystalline layer can be made into a p-Si monocrystalline film.

This p-Si monocrystalline film was etched so that only the regions to form the respective photodiodes remained. Then, n+-type regions 21 were formed in the remaining island-shaped p-Si monocrystalline regions 20 by implantation of arsenicions using a photoresist mask. In the portions of the island-shaped p-Si monocrystalline regions 20 other than the n+-type regions 21, p+-type regions 22 were formed by implantation of boron irons using a photoresist mask. After a SiO₂ film 23 was formed on the entire surface, the SiO₂ films 19 and 23 on the source-contact region and the gate-contact region (not shown) of the vertical MOSFET and the SiO₂ film 23 on the n+-type contact regions and the p+-type contact regions of the photodiodes were removed by an etching treatment to expose the Si surface.

Then, after forming an Al film on the entire surface, Al wirings 24 and 25 were formed into their respective predetermined patterns by an etching treatment. Although not shown in FIG. 1, the Al wirings 24 corresponding to the source electrode are connected to each other and further connected to the Al wiring 25 formed on the photodiode located at one end of the photodiode array. Moreover, the n+-Si polycrystalline film 18 corresponding to the gate electrode is connected to the photodiode located at the other end of the photodiode array through the above-mentioned gate-contact region. Accordingly, an equivalent circuit of the optically coupled semiconductor relay device of this example can be represented as shown in FIG. 6. Finally, a Si₃N₄ film (not shown) was formed as a surface protective film, and thereafter an etching treatment was performed so that only the pad parts corresponding to the contacts with external wirings were exposed.

Figure 4B:
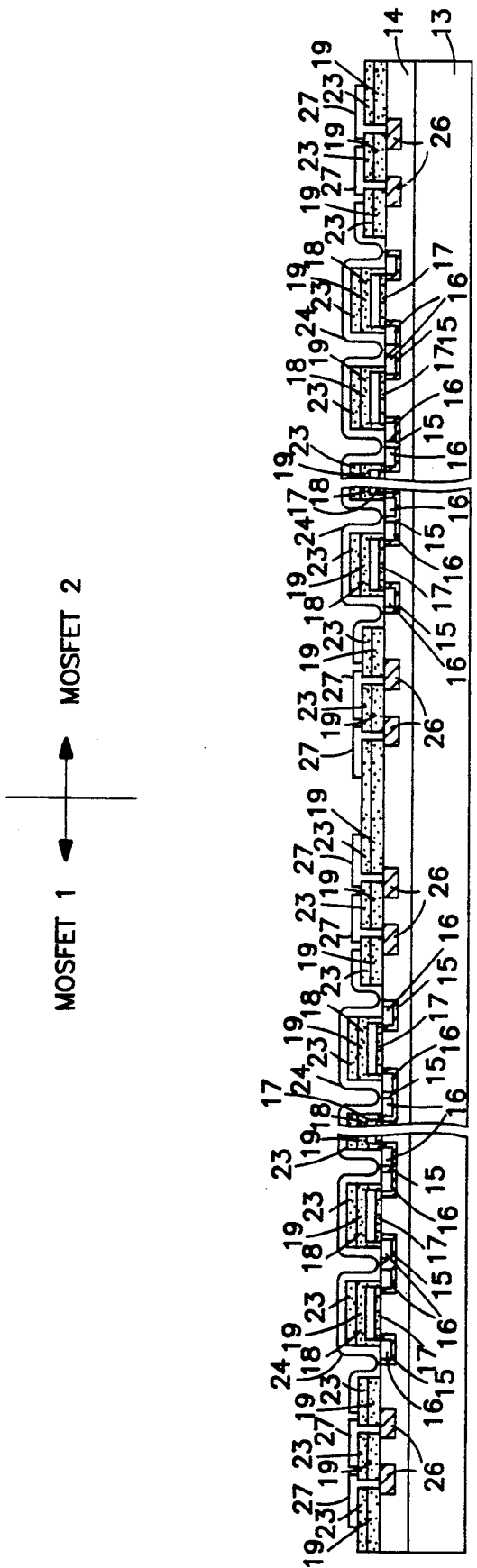
FIG. 4b is a crossectional view of the optically driven semiconductor device taken along line B—B' of FIG. 3.

FIG. 4A is a fragmentary sectional view along line A—A' of FIG. 3 showing the vicinity of guard rings. The guard rings 26 were p-type regions, which were formed at a time in forming the above-mentioned p-type regions 15. Moreover, the SiO₂ films 19 and 23 on the guard ring were formed at a time in forming the above-mentioned SiO₂ films 19 and 23, and Al electrodes 27 on the SiO₂ films 19 and 23 were formed at a time in forming the above-mentioned Al wirings 24. FIG. 4b is a cross-sectional view of a pair of vertical field effect transistors of the optically driven semiconductor device taken along line B—B' of FIG. 3. The field effect transistors share the substrate as drain. FIG. 4a relates only to a section of MOSFET 8. FIG. 4B is a cross-sectional view across MOSFETs 8 and 9.

In this example, although the photodiodes were formed by implantation of arsenic ions into the p-Si monocrystalline film, the photodiodes may also be formed by implantation of boron ions into the n-Si monocrystalline film.

EXAMPLE 2

FIG. 5 is a fragmentary perspective view showing another vertical MOSFET with a photodiode array disposed over an insulating film, which is used for the optically coupled semiconductor relay device of this invention. The fabricating processes are the same as those of the above-mentioned example up to the step of forming the SiO₂ film 19 on the entire surface.

Then, a nickel-chromium layer was formed on the entire surface of the SiO₂ film 19, after which patterning was performed so that only the regions to form photodiodes remained, resulting in island-shaped lower layer electrodes 28. A p-Si amorphous film 29 was formed on the entire surface, and patterning was performed so that a portion of the island-shaped lower layer electrodes 28 was exposed. Thereafter, an n-Si amorphous film 30 was further formed on the entire surface, and patterning was performed so that the top surface and the side surface of the island-shaped p-Si amorphous film 29 were covered and a portion of the lower layer electrodes 28 was exposed.

Subsequently, an indium oxide film 31 containing tin was formed on the entire surface as an upper layer transparent electrode, and patterning was performed so that the top surface and the side surface of the island-shaped n-Si amorphous film 30 were covered and the lower layer electrodes 28 were connected to the n-Si amorphous film 30 of the adjacent photodiodes.

Finally, the $SiO_2$ film 19 on the source-contact region and the gate-contact region (not shown) of the vertical MOSFET was removed by an etching treatment, and the Si surface was exposed. Then, an Al film was formed on the entire surface, and thereafter Al wirings 32 were formed in a predetermined pattern by an etching treatment. Although not shown in FIG. 5, the Al wirings 32 corresponding to the source electrode are connected to each other and further connected to an indium oxide film 31 containing tin formed on the photodiode located at one end of the photodiode array. Moreover, the $n^+$-Si polycrystalline film 18 corresponding to the gate electrode is connected to the photodiode located at the other end of the photodiode array through the above-mentioned gate-contact region. Accordingly, an equivalent circuit of the optically coupled semiconductor relay device of this example can also be represented as shown in FIG. 6.

In addition, the structure in the vicinity of the guard rings is the same as that of the above-mentioned example except that there is no $SiO_2$ film 23.

In this example, although the n-Si amorphous film was formed on the p-Si amorphous film, the p-Si amorphous film may be formed on the n-Si amorphous film. Alternatively, the p-i-n structure or the n-i-p structure can be employed.

EXAMPLE 3

Figure 8A:
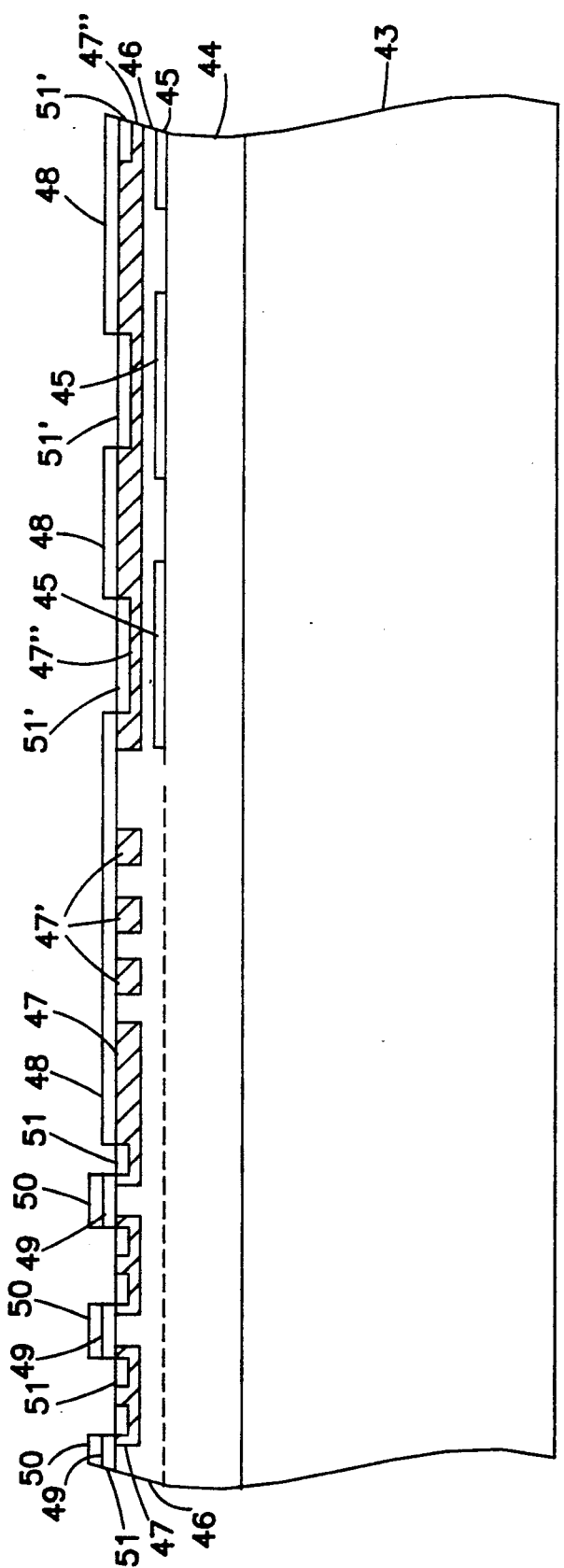
FIGS. 8a and 8b are fragmentary sectional views of still another optically driven semiconductor device of this invention.
Figure 8B:
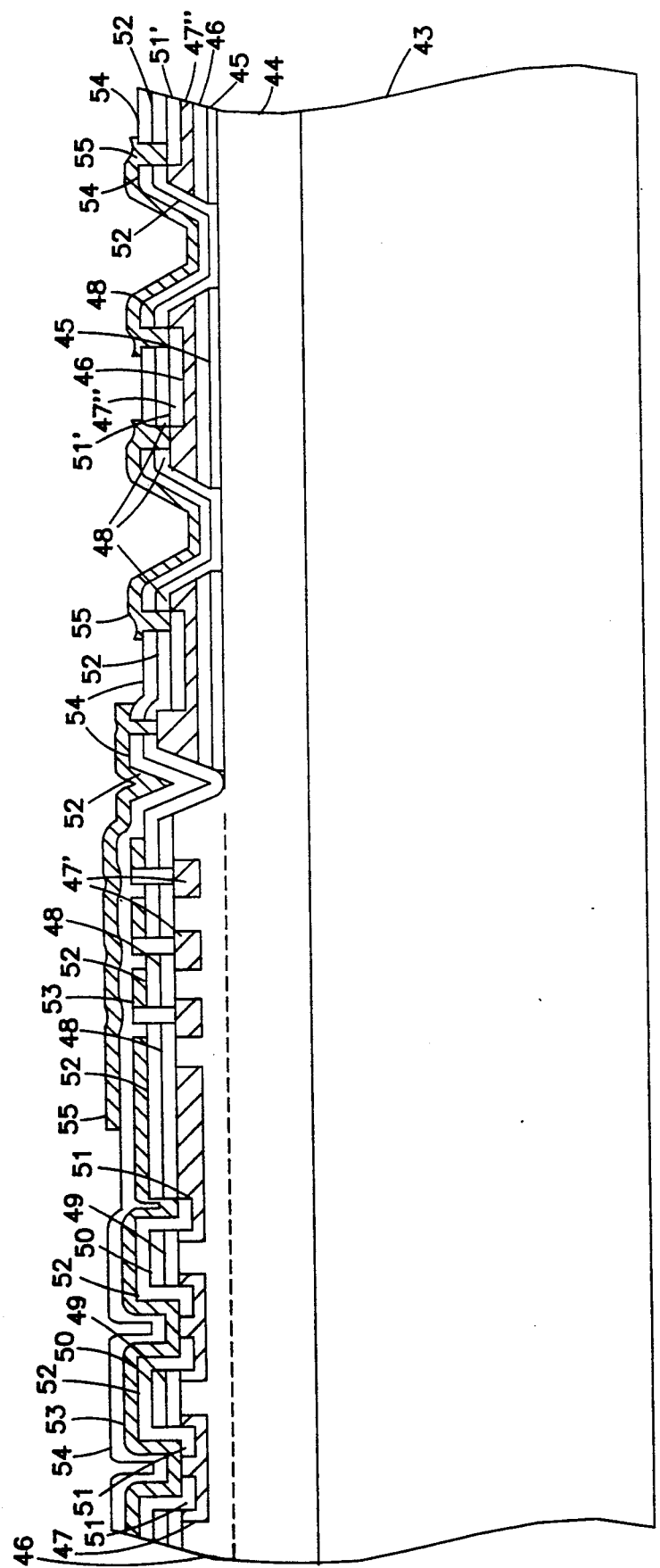

In this example, still another optically driven semiconductor device of this invention will be explained, in which a vertical MOSFET and a solar cell are disposed in a planar form on a Si substrate. FIGS. 8a and 8b are fragmentary sectional views showing the optically driven semiconductor device.

First, on an $n^+$-Si (100) wafer 43 used as a substrate, there was formed an $n^-$-Si epitaxial monocrystalline layer 44. this $n^-$-Si epitaxial monocrystalline layer 44 was formed by reduction of $SiCl_4$ with hydrogen at a temperature in the region of about 1100° to 1300° C. while allowing a predetermined doping gas such as $PH_3$ to flow. This monocrystalline layer 44 can also be formed by thermal decomposition of $SiH_4$ at a temperature in the region of about 900° to 1000° C., while allowing a predetermined doping gas such as $PH_3$ to flow. The $n^-$-Si epitaxial monocrystalline layer 44 had the thickness of about 30 μm and the resistivity of 50 to 55Ω.

Then, an insulating film 45 was formed on the entire surface of this $n^-$-Si epitaxial monocrystalline layer 44, and thereafter the portions of the insulating film 45 other than the region in which the solar cell elements were to be incorporated were removed by the photoetching technique or the selective etching technique. The insulating film 45 made of $SiO_2$, $Si_3N_4$ or the like, can be formed by the thermal-oxidation method, the low temperature CVD method, the plasma CVD method or the like.

Furthermore, a Si layer 45 was formed on the $n^-$-Si epitaxial monocrystalline layer 44 and the insulating film 45. On the $n^-$-Si epitaxial monocrystalline layer 44, the Si layer 46 is composed of a Si epitaxial monocrystalline layer and on the insulating film 45, the Si layer 46 is composed of Si monocrystals formed by lateral vapor deposition and Si crystal grains grown from nuclei generated on the insulating film 45. This Si layer 46 was formed by the reduction of $SiCl_4$ with hydrogen at a temperature in the region of 1100° to 1300° C., or by thermal decomposition of $SiH_4$ at a temperature in the region of 900° to 1100° C. Since the Si layer 46 was formed at such high temperatures, the Si monocrystalline portion formed by lateral vapor deposition on the insulating film 45 was large in area, and the enlarged Si crystal grains were obtained because of a small number of nucleus formed on the insulating film 45. The layer thickness of the Si layer 46 was set from 3 to 20 μm in consideration of the conversion efficiency of the solar cell to be formed later in the region on the insulating film 45. Moreover, the resistivity of the Si layer 46 was 50 to 55Ω, which was similar to that the $n^-$-Si epitaxial monocrystalline layer 44.

Then, a $SiO_2$ film a mask was formed on the entire surface, and thereafter this $SiO_2$ film was formed into a predetermined pattern by the selective etching technique.

In this case, the $SiO_2$ film corresponding to a mask can be formed by the thermal oxidation method, the CVD method, or the like. Moreover, for the selective etching technique, any a photoetching technique can be used.

After boron ions were implanted into the Si layer 46, which had been masked with the $SiO_2$ as described above, by ion implantation under predetermined conditions, drive-in treatment was applied to form p-Si wells 47 constituting the channel part of the vertical MOSFET, p-Si guard rings 47' to withstand a higher voltage, and p-Si diffusion layers 47" for p-n junctions in the solar cell elements. In the drive-in treatment, prolonged heat treatment was performed in an atmosphere of oxygen at a temperature of about 1100° C., and therefore $SiO_2$ films with a thickness of thousands of angstroms were also formed on the p-Si wells 47, the p-Si guard rings 47', and the p-Si diffusion layers 47". These $SiO_2$ films and the $SiO_2$ film used as a mask were made into $SiO_2$ films 48 of predetermined patterns as shown in FIG. 8a by removing the respective portions corresponding to the channel region and the source-contact region of the vertical MOSFET and the portions corresponding to the n-Si diffusion layer of the solar cell elements with the use of the photoetching technique or the selective etching technique.

Subsequently, a $SiO_2$ film with a thickness of about 1000Å was formed by thermal oxidation, and a polycrystalline Si film was formed on this $SiO_2$ film by thermal decomposition of $SiH_4$. Unnecessary portions of the $SiO_2$ film and the polycrystalline Si film were removed by the photoetching technique or the selective etching technique (e.g., reactive ion etching), and thereby the gate part of the vertical MOSFET comprising a $SiO_2$ gate insulating film 49 and a polycrystalline Si film 50 was formed.

Then, as shown in FIG. 8b, $n^+$-Si diffusion layers 51 and 51' were formed on the source-contact region of the vertical MOSFET and the portions corresponding to the photodetecting surface of the solar cell by ion implantation or thermal diffusion, respectively, after which unnecessary portions of the $SiO_2$ films 48 on the vertical MOSFET and the $SiO_2$ films formed on the $n^+$-Si diffusion layers 51 and 51' when using the thermal diffusion method were removed by the photoetching technique or the selective etching technique.

Subsequently, the SiO$_2$ films 48, the p-Si diffusion layers 47", and the Si layer 46 of the predetermined patterns to be unnecessary were successively removed by the photoetching technique or the selective etching technique, and island-shaped regions in which the solar cell elements were to be incorporated, were separated from each other, and thereafter an insulating film 52 consisting of SiO$_2$ or the like was formed on the entire surface. This insulating film 52 can be formed by the low-temperature CVD method, plasma CVD method, or the like.

The predetermined regions of the n$^+$-Si diffusion layers 51, and the p-Si wells 47 corresponding to the electrode contact part in the source region of the vertical MOSFET, and the predetermined region of the p-Si guard rings 47' were removed by the photoetching technique or the selective etching technique, and thereafter the entire surface was coated with a film of deposited Al. This deposited-Al film can be formed by sputtering, electron beam evaporation, or the like. An Al wiring 53 of a predetermined pattern was formed by removing the unnecessary portions of this deposited-Al film by the photoetching technique or the selective etching technique, and thereafter the entire surface was coated with an insulating film 54. This insulating film 54 made of SiO$_2$, Si$_3$N$_4$, or the like, can be formed by the low-temperature CVD method, the plasma CVD method, or the like.

Subsequently, the electrode contact part of each solar cell element and the predetermined electrode part (not shown) of the Al wiring 53 were formed, and thereafter the solar cell elements were connected to each other by forming an Al wiring 55 of a predetermined pattern in the same manner as to form the above-mentioned Al wiring 53. These solar cell elements are connected in series to constitute a high voltage output solar cell. Moreover, the Al wiring 55 extends over the Al wiring 53 in the p-Si guard ring part, by which the Al wiring 53 and the solar cell elements are connected to each other through the predetermined electrode part.

Thus, the optically driven semiconductor device as shown in FIG. 8a was obtained in which the vertical MOSFET and the high voltage output solar cell were disposed in a planar form on the substrate. In this example, the vertical MOSFET and the solar cell were formed on the same substrate at a time, so that the p-Si diffusion layer and the n-Si diffusion layer can be treated at a time in the same step, and thus the manufacturing process was simplified.

Moreover, in the optically driven semiconductor device of this example, a peripheral circuit for improving the rate of switching operation was not incorporated thereinto, but this device can incorporate a peripheral circuit containing a depletion type MOSFET or the like as in Example 4 described below.

EXAMPLE 4

Figure 9A:
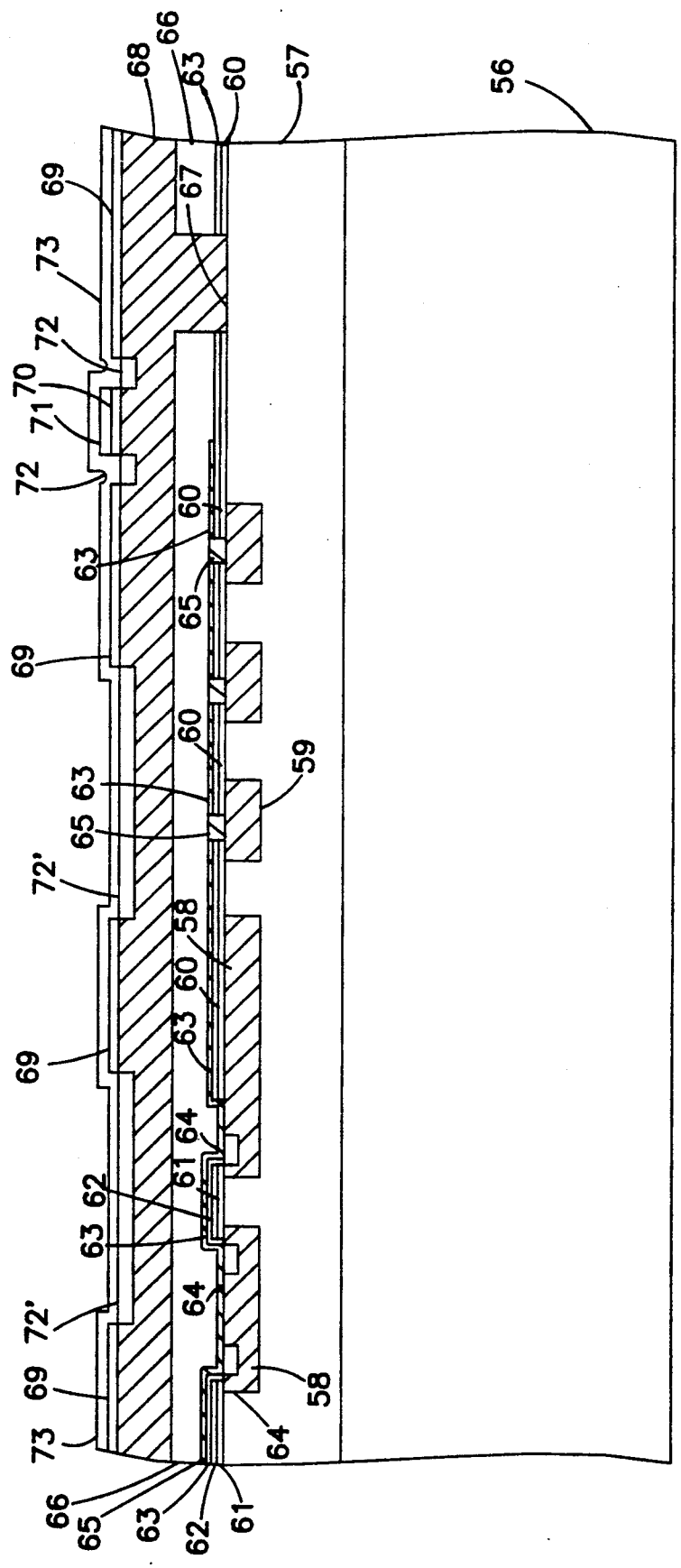
FIGS. 9a and 9b are fragmentary sectional views of still another optically driven semiconductor device of this invention.
Figure 9B:
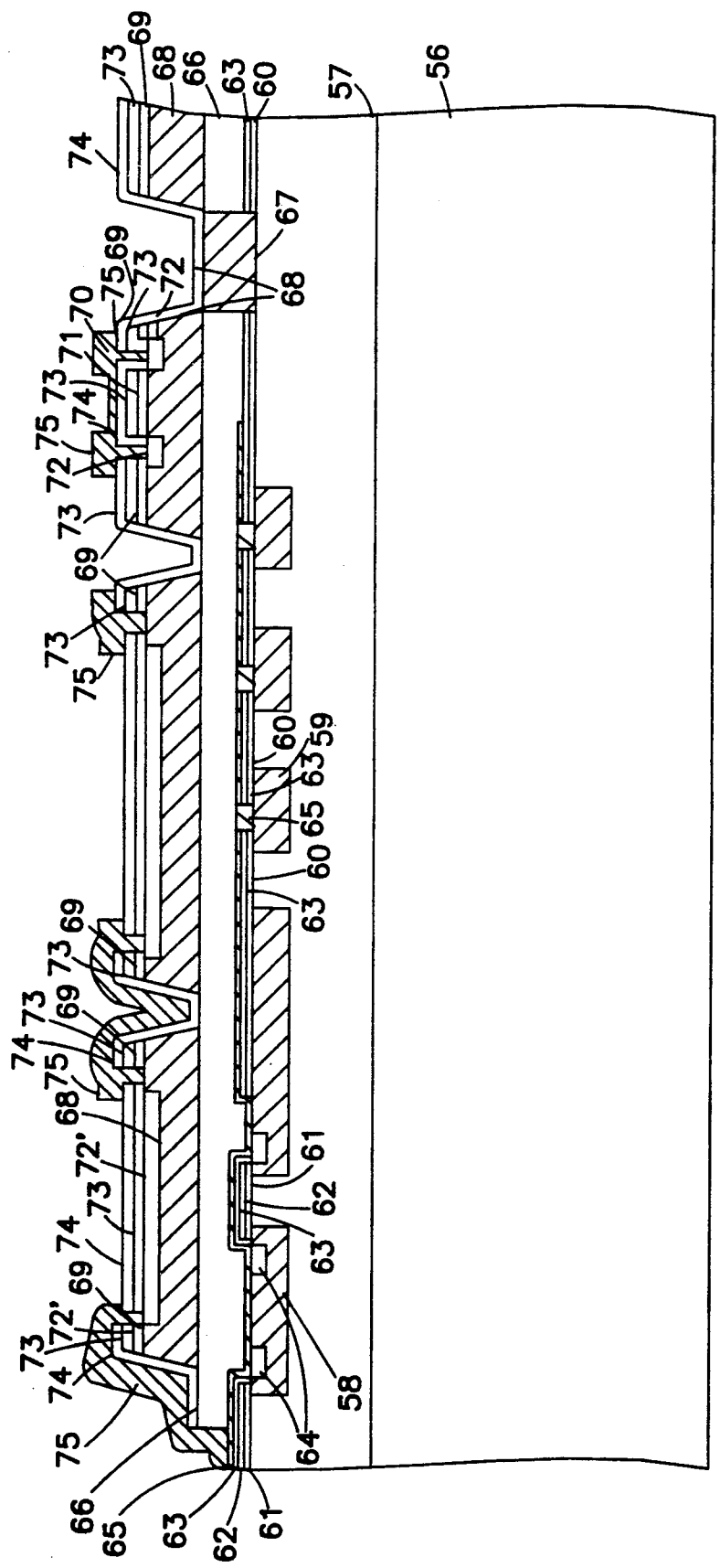

In this example, still another optically driven semiconductor device of this invention will be explained, in which a vertical MOSFET is disposed on a substrate and a high voltage output solar cell is disposed on an insulating film above the vertical MOSFET. FIGS. 9a and 9b are fragmentary sectional views showing the optically driven semiconductor device.

First, an n$^+$-Si (100) wafer 56 was used as a substrate, and in the same manner as in Example 3, an n$^-$-Si epitaxial monocrystalline layer 57 was formed on the substrate, followed by the formation of p-Si wells 58, p-Si guard rings 59, a surface protective insulating film 60, a SiO$_2$ gate insulating film 61, a polycrystalline Si film 62, a protective insulating film 63, and a n$^+$-Si diffusion layer 64 in the source region of the vertical MOSFET. The surface protective insulating film 60 and the protective insulating film 63 were made of SiO$_2$, Si$_3$N$_4$, or the like.

Subsequently, the entire surface was coated with a heatresistant conductive film, and a heatresistant wiring 65 of a predetermined pattern was formed by the photoetching technique or the selective etching technique. This heatresistant conductive film made of W, Mo, WSi$_2$, MoSi$_2$, or the like, can be formed by sputtering, electron beam evaporation, low-temperature CVD, or the like.

An insulating film 66 was deposited on the heat-resistant wiring 65 thus formed, and thereafter the surface protective insulating film 60, the protective insulating film 63, and the insulating film 66 were successively removed by the photoetching technique or the selective etching technique, resulting in a seed part 67 of a predetermined pattern. This insulating film 66 made of SiO$_2$, Si$_3$N$_4$, or the like, can be formed by low-temperature CVD, plasma CVD, or the like.

A p-Si layer 68 was formed on the insulating film 66 and the seed part 67. On the seed part 67 and the insulating film 66 in the vicinity of the seed part 67, the p-Si layer 68 was made of a Si epitaxial monocrystalline layer and on the insulating film 66 apart from the seed part 67, the p-Si layer 68 was made of Si polycrystal graine grown greatly from the nucleus generated on the insulating film 66. This p-Si layer 68 was formed by the ELO technique utilizing thermal decomposition of SiH$_4$ at a temperature in the region of 900° to 1100° C.

Then, an insulating film 69 made of SiO$_2$ or the like was formed on the entire surface of the p-Si layer 68 by low-temperature CVD or the like, and thereafter the portions of the insulating films 69 corresponding to the photodetecting surface of the solar cell elements in the Si polycrystalline layer formed on the insulating film 66 apart from the seed part 67 and the portions of the insulating film 69 corresponding to the depletion type MOSFET in the Si epitaxial monocrystalline layer formed on the insulating film in the vicinity of the seed part 67 were removed by the photoetching technique or the selective etching technique. In the same manner as in Example 3, n$^+$-Si diffusion layers 72 in the drain region and the source region of the vertical MOSFET and n$^+$-Si diffusion layers 72' for p-n junctions in the solar cell elements were formed, and thereafter a protective insulating film 73 made of SiO$_2$ or the like was formed on the entire surface by the low-temperature CVD method or the like. FIG. 9a is a fragmentary sectional view in this stage.

Subsequently, the protective insulating film 73, the insulating film 69, and the p-Si layer 68 of the predetermined patterne to become unnecessary were successively removed by the photoetching technique or the selective etching technique, so that the solar cell elements and the peripheral circuit part containing a depletion type MOSFET were separated from each other, and thereafter a protective insulating film 74 was formed on the entire surface by the low-temperature CVD method or the like.

The predetermined regions of the respective protective insulating films 73 and 74 in the solar cell elements and the depletion type MOSFET and a predetermined region of the heat-resistant wiring 65 corresponding to the contact region with the vertical MOSFET were removed by the photoetching technique or the selective etching technique, and thereafter an Al wiring 75 was formed in the same manner as in Example 3.

Thus, the optically driven semiconductor device as shown in FIG. 9a was obtained in which the high voltage output solar cell made of Si polycrystals was disposed on the insulating film above the vertical MOSFET. In the optically driven semiconductor device of this example, the peripheral circuit containing a depletion type MOSFET is disposed on the Si epitaxial monocrystalline layer which has been formed on the above-mentioned insulating film, with the use of a seed part for growing Si monocrystals formed to utilize the ELO technique. By disposing such a peripheral circuit, the rate of switching operation of this optically driven semiconductor device was improved. Moreover, when no peripheral circuit is disposed, the solar cell elements can also be produced by growing only the Si polycrystalline layer on the above-mentioned insulating film without forming the above-mentioned seed part.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An optically driven semiconductor device having a first output terminal and a second output terminal comprising:

a semiconductor substrate of a first conductivity type;
   a pair of vertical field effect transistors formed on said substrate, each of said transistors being composed of a plurality of vertical transistor elements which comprise a first semiconductor layer of a second conductivity type formed on said substrate, a second semiconductor layer of a third conductivity type formed in the surface area of said first semiconductor layer, a third semiconductor layer of the first conductivity type formed in the surface area of said second semiconductor layer, a gate insulating film formed on said first semiconductor layer so as to come in contact with said second semiconductor layer, and a gate semiconductor layer formed on said gate insulating film; and
   a pair of optoelectric transducers, each of which is formed on an insulating film above a corresponding transistor and connected between the gate and the source of said corresponding transistor, and each of said optoelectric transducers comprising a fourth semiconductor layer of the third conductivity type formed on said insulating film and a fifth semiconductor layer of the first conductivity type formed in the surface area of said fourth semiconductor layer,
   wherein said pair of transistors have the substrate in common as a drain and are connected in reverse series with each other between said first output terminal and said second output terminal.

2. An optically driven semiconductor device according to claim 1, wherein said optoelectric transducer is a photodiode array.

3. An optically driven semiconductor device according to claim 1, wherein said transistor is of metal oxide semiconductor type.

4. An optically driven semiconductor device having a first output terminal and a second output terminal comprising:

a semiconductor substrate of a first conductivity type;
   a pair of vertical field effect transistors formed on said substrate, each of said transistors being composed of a plurality of vertical transistor elements which comprise a first semiconductor layer of a second conductivity type formed on said substrate, a second semiconductor layer of a third conductivity type formed in the surface area of said first semiconductor layer, a third semiconductor layer of the first conductivity type formed in the surface area of said second semiconductor layer, a gate insulating film formed on said first semiconductor layer so as to come in contact with said second semiconductor layer, and a gate semiconductor layer formed on said gate insulating film; and
   a pair of optoelectric transducers, each of which is formed on an insulating film above the corresponding transistor and connected between the gate and the source of said corresponding transistor, and each of said optoelectric transducers comprising a fourth semiconductor layer of the third conductivity type formed above said insulating film and a fifth semiconductor of the second conductivity type formed on said fourth semiconductor layer,
   wherein said pair of transistors have the substrate in common as a drain and are connected in reverse series with each other between said first output terminal and said second output terminal.

5. An optically driven semiconductor device according to claim 4, wherein said optoelectric transducer is a photodiode array.

6. An optically driven semiconductor device according to claim 4, wherein said transistor is of metal oxide semiconductor type.

7. An optically coupled semiconductor relay device comprising a light emitting part for generating an optical signal and a photodetector part for performing switching operation according to said optical signal, wherein said photodetector part has an optically driven semiconductor device of claim 4.

8. An optically coupled semiconductor relay device according to claim 7, wherein said light emitting part has at least one light emitting diode.

* * * * *